(12) United States Patent
Soeno (10) Patent No.: US 8,362,519 B2
(45) Date of Patent: Jan. 29, 2013

(54) SEMICONDUCTOR DEVICE

(75) Inventor: Akitaka Soeno, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 13/315,841

(22) Filed: Dec. 9, 2011

(65) Prior Publication Data

US 2012/0080718 A1   Apr. 5, 2012

Related U.S. Application Data

(63) Continuation of application No. PCT/JP2009/060685, filed on Jun. 11, 2009.

(51) Int. Cl.
*H01L 29/74* (2006.01)
*H01L 31/111* (2006.01)

(52) U.S. Cl. ........ 257/140; 257/146; 257/133; 257/139; 438/135

(58) Field of Classification Search ............... 257/140, 257/133, 139, 146, E27.016; 438/135
See application file for complete search history.

(56) References Cited

U.S. PATENT DOCUMENTS

| | | | |
|---|---|---|---|
| 5,360,984 A | 11/1994 | Kirihata | |
| 5,463,241 A | 10/1995 | Kubo | |
| 5,751,024 A | 5/1998 | Takahashi | |
| 5,998,268 A | 12/1999 | Tomatsu et al. | |
| 6,001,678 A | 12/1999 | Takahashi | |
| 6,008,520 A | 12/1999 | Darwish et al. | |
| 6,040,599 A | 3/2000 | Takahashi | |
| 6,221,721 B1 * | 4/2001 | Takahashi | 438/270 |
| 6,518,624 B2 | 2/2003 | Kim et al. | |
| 6,518,629 B1 | 2/2003 | Kishida et al. | |
| 6,566,691 B1 * | 5/2003 | Inoue et al. | 257/139 |
| 6,768,168 B1 | 7/2004 | Takahashi | |
| 7,112,843 B2 | 9/2006 | Takaishi | |
| 2002/0153586 A1 | 10/2002 | Majumdar et al. | |
| 2002/0179968 A1 | 12/2002 | Pfirsch | |
| 2005/0017290 A1 | 1/2005 | Takahashi | |
| 2007/0080407 A1 | 4/2007 | Kono | |
| 2007/0114598 A1 | 5/2007 | Hotta et al. | |
| 2007/0200138 A1 | 8/2007 | Ozeki et al. | |

(Continued)

FOREIGN PATENT DOCUMENTS

| | | |
|---|---|---|
| EP | 2 003 694 A2 | 12/2008 |
| JP | 62-136850 A | 6/1987 |

(Continued)

OTHER PUBLICATIONS

Extended European Search Report mailed Sep. 13, 2012.

(Continued)

*Primary Examiner* — Theresa T Doan
(74) *Attorney, Agent, or Firm* — Kenyon & Kenyon LLP (57) ABSTRACT

The present teachings provide a semiconductor device comprising: an IGBT element region, a diode element region and a boundary region provided between the IGBT element region and the diode element region are formed in one semiconductor substrate. The boundary region comprises a second conductivity type first diffusion region, a first conductivity type second diffusion region, and a second conductivity type third diffusion region. A first drift region of the IGBT element region contiguously contacts the first diffusion region of the boundary region, and a second drift region of the diode element region contiguously contacts the first diffusion region of the boundary region. A first body region of the IGBT element region contiguously contacts the second diffusion region of the boundary region, and a second body region of the diode element region contiguously contacts the second diffusion region of the boundary region.

3 Claims, 4 Drawing Sheets

U.S. PATENT DOCUMENTS

| | | |
|---|---|---|
| 2008/0093697 A1 | 4/2008 | Kaneda et al. |
| 2008/0197379 A1 | 8/2008 | Aono et al. |
| 2008/0258172 A1 | 10/2008 | Takahashi |

FOREIGN PATENT DOCUMENTS

| | | | |
|---|---|---|---|
| JP | 05-152574 A | 6/1993 |
| JP | 08-316479 A | 11/1996 |
| JP | 09-270513 A | 10/1997 |
| JP | 10-270693 A | 10/1998 |
| JP | 10-294461 A | 11/1998 |
| JP | 2001-168324 A | 6/2001 |
| JP | 2002-314082 A | 10/2002 |
| JP | 2003-101020 A | 4/2003 |
| JP | 2005-057235 A | 3/2005 |
| JP | 2005-210047 A | 8/2005 |
| JP | 2006-173296 A | 6/2006 |
| JP | 2007-103770 A | 4/2007 |
| JP | 2007-227806 A | 9/2007 |
| JP | 2008-205015 A | 9/2008 |
| JP | 2008-227237 A | 9/2008 |
| JP | 2008-227238 A | 9/2008 |
| JP | 2008-300529 A | 12/2008 |
| JP | 2009-253004 A | 10/2009 |

OTHER PUBLICATIONS

Translation of International Search Report mailed Sep. 15, 2009 of PCT/JP2009/060685.

Written Opinion (PCT/ISA/237) mailed Sep. 15, 2009 of PCT/JP2009/060685 in Japanese.

Translation of International Preliminary Report on Patentability (PCT/IPEA/409) mailed May 11, 2010.

M. Mori, et al.: "A Novel High-Conductivity IGBT (HiGT) with a Short Circuit Capability"; Hitachi Research Laboratory, Hitachi, Ltd., Proceedings of 1998 International Symposium on Power Semiconductor Devices & ICs, Kyoto, pp. 429-432.

Hideki Nakamura, et al.: "Wide cell pitch 1200V NPT CSTBTs"; Mitsubishi Electric Corp., Proceedings of 2001 International Symposium on Power Semiconductor Devices & IDs, Osaka, pp. 299-302.

Translation of Written Opinion (PCT/ISA/237) mailed Sep. 15, 2009 of PCT/JP2009/060685.

* cited by examiner

SEMICONDUCTOR DEVICE

CROSS-REFERENCE TO RELATED APPLICATION

This application is a continuation of PCT application PCT/JP2009/060685 filed on Jun. 11, 2009 designating the United States of America, the entire contents of which are incorporated by reference herein.

TECHINICAL FIELD

The present teachings relate to a semiconductor device in which an insulating gate bipolar transistor (IGBT) element region and a diode element region are formed on one semiconductor substrate.

DESCRIPTION OF RELATED ART

Japanese Patent Application Publication No. 2005-57235 discloses a semiconductor device in which an IGBT element region and a diode element region for return current are formed in a same semiconductor substrate. The semiconductor substrate has sequentially stacked thereon a back layer, an $N^-$ layer, an N layer and a P layer, such that an $N^+$ layer is provided at part of the upper surface of the P layer. A trench gate is provided penetrating the P layer and the N layer, from the upper surface side of the semiconductor substrate and reaching the $N^-$ layer. The trench gate is adjacent to the $N^+$ layer. A $P^+$ layer or an $N^+$ layer is formed as the back layer. The region at which the back layer is a $P^+$ layer constitutes an IGBT element region, and the region at which the back layer is an $N^+$ layer constitutes a diode element region. At the IGBT element region, holes accumulate at the N layer in the vicinity of the interface with the P layer, on account of the N layer that is provided between the $N^-$ layer, which constitutes a drift region, and the P layer, which constitutes a body region. As a result, on-voltage drops during IGBT operation.

SUMMARY

In some cases, carriers may move between the IGBT element region and the diode element region, in the vicinity of a boundary between the IGBT element region and the diode element region. In the IGBT element region, for instance, carriers that are drawn to the drift region in the vicinity of the interface with the body region move towards an anode region of the diode element region, during IGBT operation. As a result, carrier density in the drift region of the IGBT element region decreases, the resistance in the drift region increases, and there rises the on-voltage during IGBT operation. A reverse recovery current flows in the diode element region when the IGBT element region is switched to an on state while return current is flowing in the diode element region. During this diode reverse recovery, carriers accumulated outside the diode element region move into the diode element region. The diode reverse recovery current increases as a result, and element breakdown becomes more likely to occur.

In the semiconductor device of the present teachings, an IGBT element region, a diode element region and a boundary region provided between the IGBT element region and the diode element region are formed in one semiconductor substrate. The IGBT element region comprises: a first conductivity type collector region, a second conductivity type first drift region formed on an upper surface side of the semiconductor substrate relative to the collector region, a first conductivity type first body region formed on the upper surface side of the semiconductor substrate relative to the first drift region, a second conductivity type emitter region formed on an upper surface side of the first body region, a second conductivity type carrier accumulation region formed in the first body region and separated from both of the first drift region and the emitter region by the first body region, and a trench gate penetrating the first body region from the upper surface side of the semiconductor substrate and reaching the first drift region. The diode element region comprises: a second conductivity type cathode region, a second conductivity type second drift region formed on the upper surface side of the semiconductor substrate relative to the cathode region, and a first conductivity type second body region formed on the upper surface side of the semiconductor substrate relative to the second drift region. The boundary region comprises: a second conductivity type first diffusion region, a first conductivity type second diffusion region formed on the upper surface side of the semiconductor substrate relative to the first diffusion region, and a second conductivity type third diffusion region formed in the second diffusion region and separated from the first diffusion region by the second diffusion region. The first drift region of the IGBT element region contiguously contacts the first diffusion region of the boundary region, and the second drift region of the diode element region contiguously contacts the first diffusion region of the boundary region. The first body region of the IGBT element region contiguously contacts the second diffusion region of the boundary region, and the second body region of the diode element region contiguously contacts the second diffusion region of the boundary region.

In the above-described semiconductor device, the second conductivity type third diffusion region is provided in the first conductivity type second diffusion region, at the boundary region. As a result, carriers that move from the back side to the upper surface side of the semiconductor substrate during IGBT operation can be inhibited from moving towards the diode element region across the boundary region. As a result, in the IGBT element region this allows increasing the amount of carrier accumulation in the drift region in the vicinity of the body region, and allows reducing on-voltage.

During diode operation, the carriers moving from the upper surface side towards the back side of the semiconductor substrate can be inhibited from moving towards the boundary region. This allows reducing the amount of carrier accumulation in the drift region of the boundary region. Reverse recovery current during diode reverse recovery can be reduced as a result, whereby element breakdown becomes less likely.

DETAILED DESCRIPTION OF INVENTION

Embodiment 1

Figure 1:
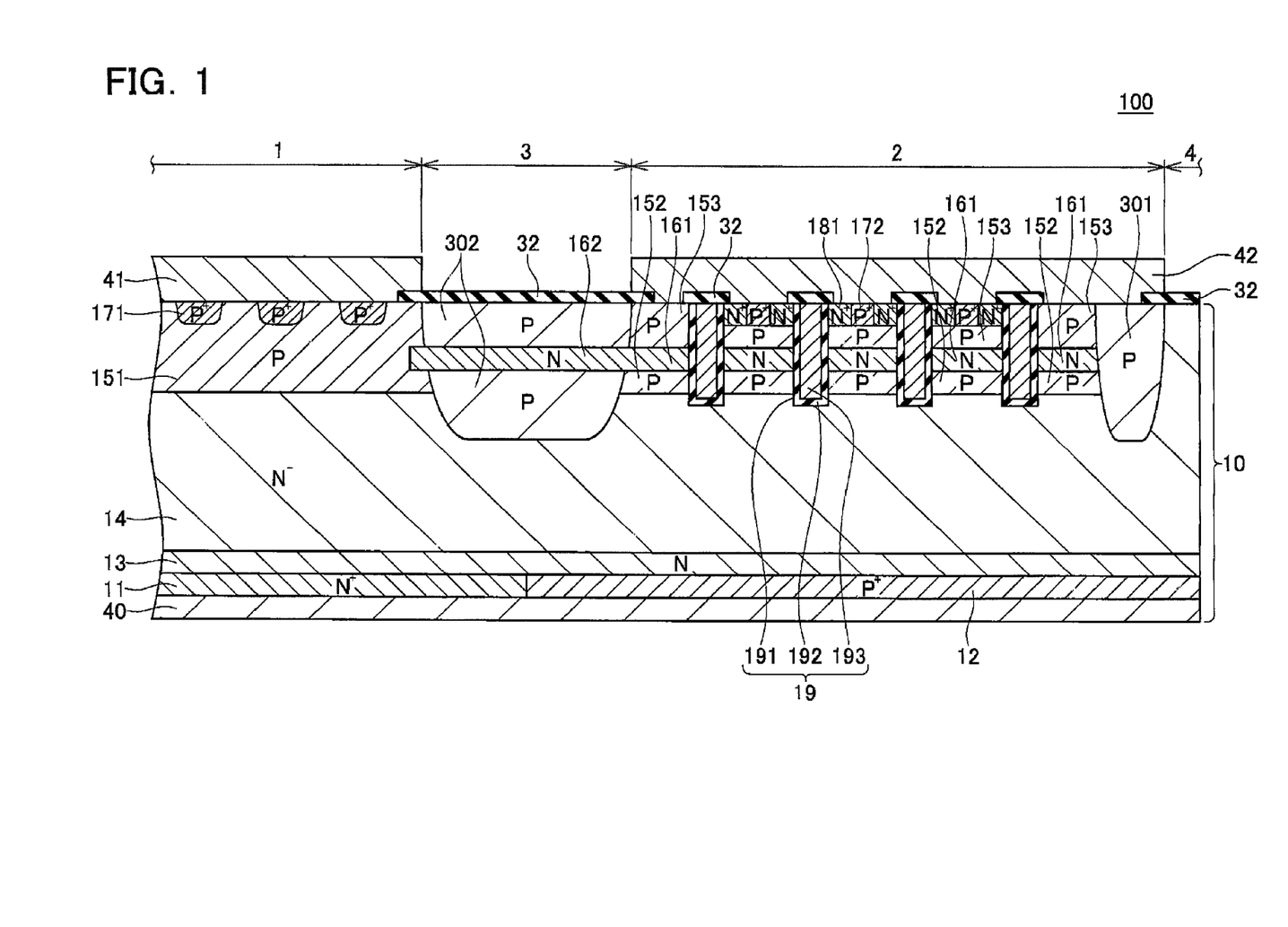
FIG. 1 is a cross-sectional diagram of a semiconductor device in Embodiment 1.
Figure 2:
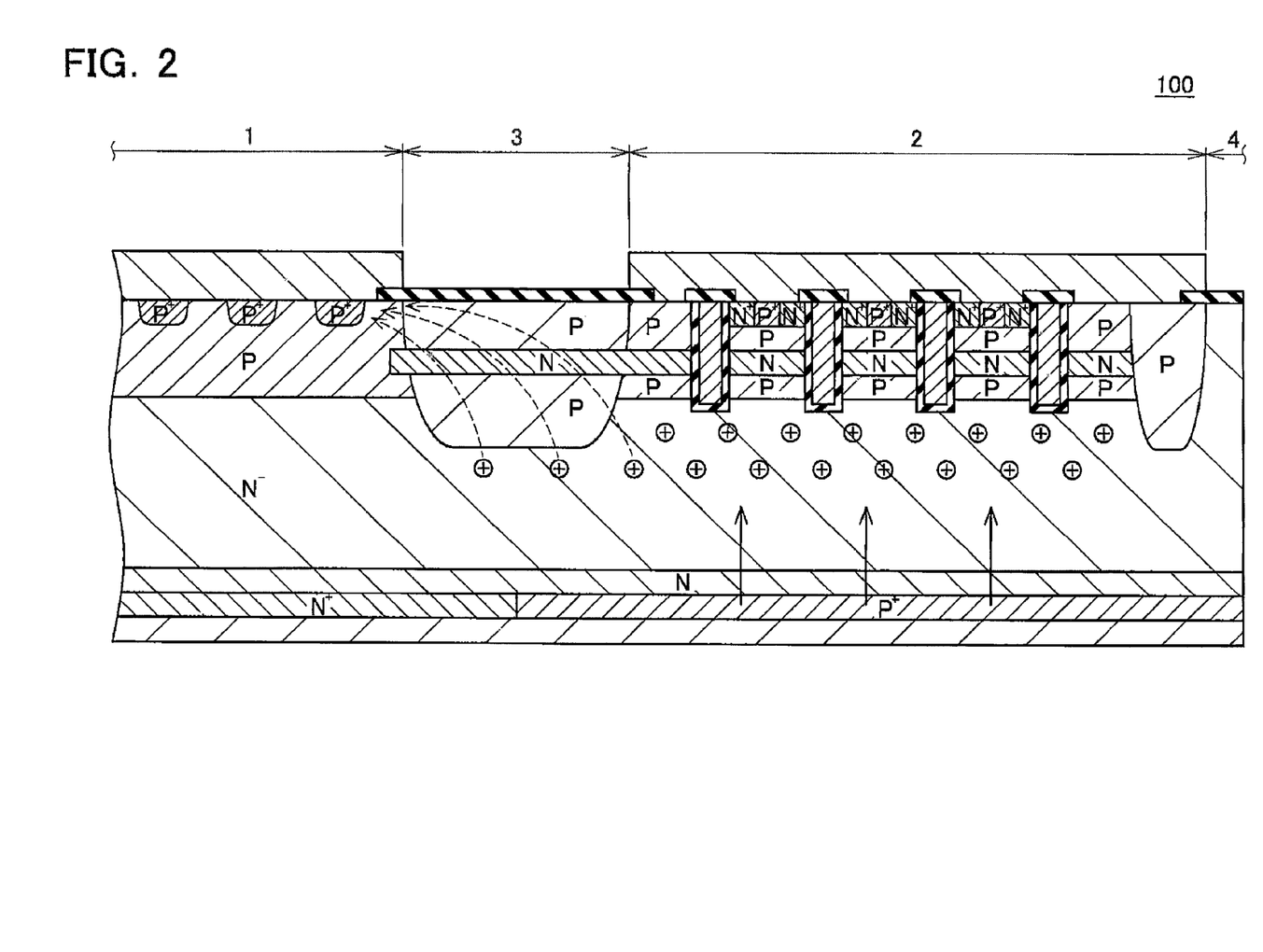
FIG. 2 is a diagram illustrating schematically the state of the semiconductor device of FIG. 1 when in IGBT operation.
Figure 3:
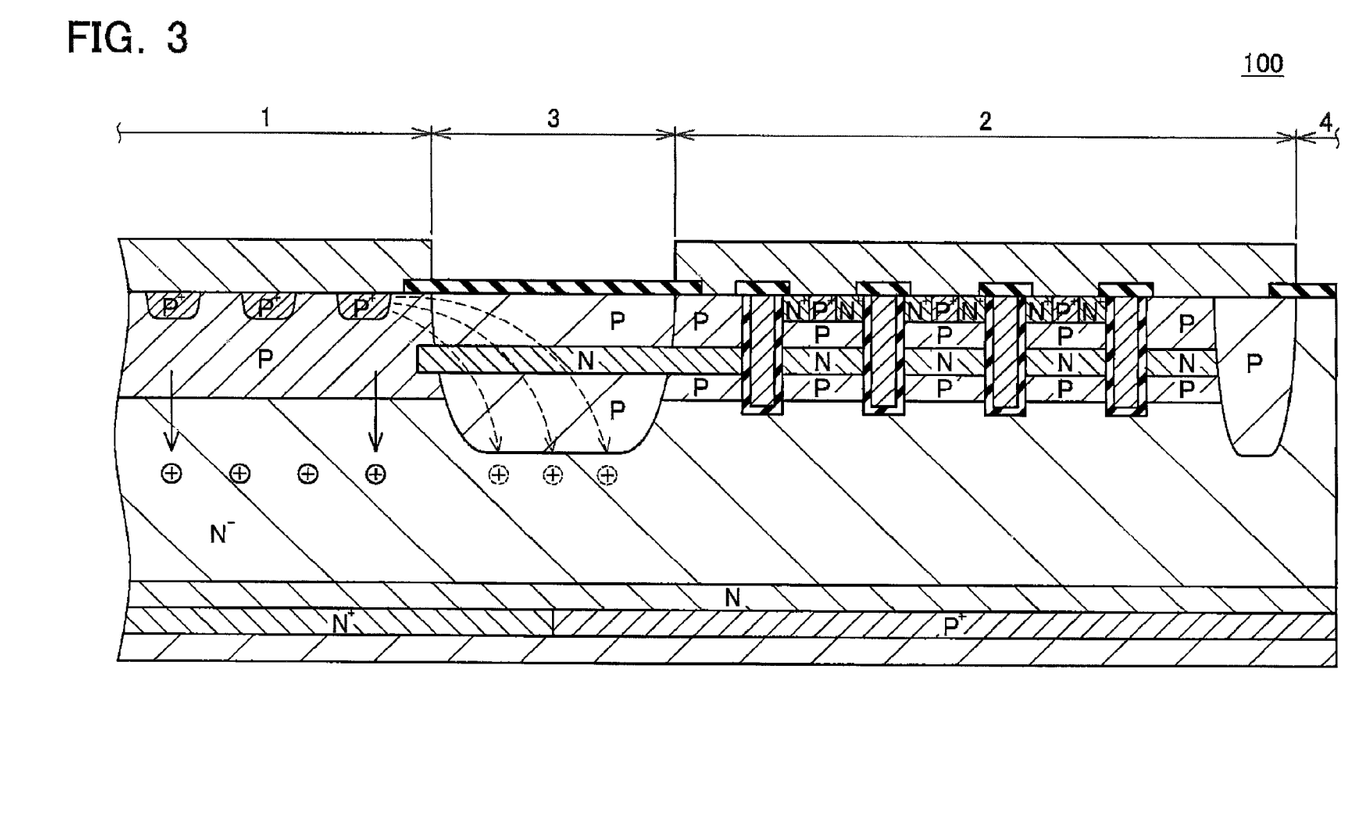
FIG. 3 is a diagram illustrating schematically the state of the semiconductor device of FIG. 1 when in diode operation.

Embodiment 1 of the present teachings will be explained below with reference to accompanying drawings. In the present embodiment an example will be explained in which the first conductivity type is P type and the second conductivity type is N type. FIG. 1 is a cross-sectional diagram of a semiconductor device 100 according to the present embodiment. FIG. 2 is a diagram illustrating schematically the state of the semiconductor device 100 illustrated in FIG. 1 when in IGBT operation, and FIG. 3 is a diagram illustrating schematically the state of the semiconductor device 100 of FIG. 1 when in diode operation. The reference numerals denoting the various features of the semiconductor device 100 illustrated in FIG. 1 are omitted in FIG. 2 and FIG. 3. The plus signs within circles in FIG. 2 and FIG. 3 represent holes. Further, in the descriptions herein, a term "contiguously contact" means that a component is making a physical contact with another component; e.g., "a layer contiguously contacting another layer" herein means that the one layer and the other layer are wholly or partially making physical contact with one another.

The semiconductor device 100 comprises a semiconductor substrate 10, a back electrode 40, a diode upper surface electrode 41 and an IGBT upper surface electrode 42. The semiconductor device 100 comprises a diode element region 1, an IGBT element region 2, a boundary region 3 and a peripheral voltage-resistant portion 4 that are formed on the semiconductor substrate 10. The semiconductor substrate 10 comprises a first $N^+$ layer 11, a first $P^+$ layer 12 adjacent to the first $N^+$ layer 11, a first N layer 13 and an $N^-$ layer 14 stacked on the upper surface of the first $N^+$ layer 11 and the first $P^+$ layer 12.

As illustrated in FIG. 1, the diode element region 1 is a region on the upper side of the first $N^+$ layer 11 of the semiconductor substrate 10, such that a back electrode 40 is provided on the back side and a diode upper surface electrode 41 on the upper surface side. In the diode element region 1, a first P layer 151, as the second body region, is stacked on the upper surface of the $N^-$ layer 14 as the second drift region. A second $P^+$ layer 171, as an anode region, is provided on the upper surface of the first P layer 151.

In the diode element region 1, the first $N^+$ layer 11 is used as a cathode region, the first N layer 13, the $N^-$ layer 14 and the first P layer 151 as conduction regions, and the second $P^+$ layer 171 as an anode region.

As illustrated in FIG. 1, the IGBT element region 2 is a region on the upper side the first $P^+$ layer 12 of the semiconductor substrate 10, such that the back electrode 40 is provided on the back side and the IGBT upper surface electrode 42 is provided on the upper surface side. In the IGBT element region 2, a second P layer 152, a second N layer 161 and a third P layer 153 are stacked on the upper surface of the $N^-$ layer 14. A third $P^+$ layer 172 and a second $N^+$ layer 181 are provided on the upper surface of the third P layer 153. In the IGBT element region 2, specifically, the second N layer 161 is separated from the $N^-$ layer 14 by the second P layer 152, and is separated from the third $P^+$ layer 172 and the second $N^+$ layer 181 by the third P layer 153. A fourth P layer 301, extending from the upper surface side of the semiconductor substrate 10 to the $N^-$ layer 14, is provided in the boundary between the IGBT element region 2 and the peripheral voltage-resistant portion 4. The lower end of the fourth P layer 301 extends deeper than the lower end of the second P layer 152.

In the IGBT element region 2, a plurality of trench gates 19 is provided from the upper surface of the semiconductor substrate 10 towards the $N^-$ layer 14. The depth of the lower end portion of the trench gates 19 is deeper than the lower end portion of the second P layer 152 but shallower than the lower end portion of the fourth P layer 301. The trench gates 19 comprise each a gate insulating film 192 formed in a trench 191, and a gate electrode 193 that fills the inside of the gate insulating film 192. An interlayer insulating film 32 is provided between the gate electrode 193 and the IGBT upper surface electrode 42. The second $N^+$ layer 181 is adjacent to the trench gate 19.

In the IGBT element region 2, the first $P^+$ layer 12 is used as a collector region, the first N layer 13 as a buffer region, the $N^-$ layer 14 as a first drift region, the second P layer 152 and the third P layer 153 as a first body region, the second $N^+$ layer 181 as an emitter region and the third $P^+$ layer 172 as a body contact region. The second N layer 161 is used as a carrier accumulation region.

The boundary region 3 is an inactive region provided between the diode element region 1 and the IGBT element region 2. At the boundary region 3 no contacts are formed with an upper surface electrode on the upper surface side of the semiconductor substrate 10. In the present embodiment, a boundary is formed, in the interior of the boundary region 3, between the first $N^+$ layer 11 and the first $P^+$ layer 12, such that the first N layer 13 and the $N^-$ layer 14 are stacked on the boundary. In the present embodiment, a fifth P layer 302, extending from the upper surface side of the semiconductor substrate 10 reaching to the $N^-$ layer 14, is provided at the boundary region 3. The fifth P layer 302 extends from the upper surface side towards the back side of the semiconductor substrate 10 along the boundary between the boundary region 3 and the IGBT element region 2, and along the boundary between the boundary region 3 and the diode element region 1. A third N layer 162 is provided penetrating the fifth P layer 302 in the plane direction (horizontal direction in FIG. 1) of the semiconductor substrate 10. The end portion of the third N layer 162 on the side of the IGBT element region 2 extends to contiguously contact the second N layer 161 that is provided in the IGBT element region 2. The end portion of the third N layer 162 on the side of the diode element region 1 extends into a part of the diode element region 1. As described above, the boundary region 3 comprises the $N^-$ layer 14 as an N type first diffusion region, the fifth P layer 302 as a P type second diffusion region that is provided on the $N^-$ layer 14 on the side of the upper surface of the semiconductor substrate 10, and the third N layer 162 as an N type third diffusion region. The third N layer 162 is provided inside the fifth P layer 302, such that the $N^-$ layer 14 and the third N layer 162 are separated by the fifth P layer 302. The third N layer 162 extends until contiguously contacting the second N layer 161 as an N type carrier accumulation region that is provided in the IGBT element region 2.

In the present embodiment, the second N layer 161 and the third N layer 162 are formed as one same layer in the semiconductor substrate 10. In the manufacturing process of the semiconductor device 100, the third N layer 162 can be formed at the same time that the second N layer 161 is formed. As a result, the time and cost of the manufacturing processes are not significantly increased.

As described above, the semiconductor device 100 is a reverse conduction-type semiconductor device in which the IGBT element region 2, the diode element region 1 and the boundary region 3 disposed between the IGBT element region 2 and the diode element region 1 are provided on one same semiconductor substrate 10. The first drift region of the IGBT element region 2, the second drift region of the diode element region 1 and the first diffusion region of the boundary region 3 are formed in the semiconductor substrate 10 in the form of the $N^-$ layer 14 that is one same layer. As a result, the first drift region of the IGBT element region contiguously contacts the first diffusion region of the boundary region, and the second drift region of the diode element region contiguously contacts the first diffusion region of the boundary region. The second P layer 152 and the third P layer 153, which are the first body region of the IGBT element region 2, contiguously contact the fifth P layer 302 that is the second diffusion region of the boundary region 3. The first P layer 151, which is the second body region of the diode element region 1 contiguously contacts the fifth P layer 302 that is the second diffusion region of the boundary region 3. The third N layer 162, as the N type third diffusion region provided in the boundary region 3, extends until contiguously contacting the second N layer 161 as the N type carrier accumulation region provided in the IGBT element region 2.

The operation of the semiconductor device 100 is explained next.

(During IGBT operation)

A channel forms at the IGBT element region 2, in the second P layer 152 and the third P layer 153 which are the first body region, in the vicinity of the trench gate 19, upon application of a positive voltage (positive bias) to the gate electrode 193 and the potential Va of the back electrode 40 is set to a higher potential than the potential Vb of the diode upper surface electrode 41 and the potential Vc of the IGBT upper surface electrode 42 (Va>Vb, Vc). By this channel, electrons being majority carriers are injected from the second N$^+$ layer 181, which is an emitter region, into the N$^-$ layer 14, which is the first drift region. Holes are injected from the first P$^+$ layer 12, which is a collector region, into the first N layer 13 and the N$^-$ layer 14. Upon injection of holes, which are minority carriers, conductivity modulation is elicited in the N$^-$ layer 14, which is a drift region, and there drops the resistance of the N$^-$ layer 14. IGBT current flows thereby, through the motion of electrons and holes, from the back side of the semiconductor device (collector region side) towards the upper surface side (emitter region side). On the other hand, no current flows in the diode element region 1.

Thus, a high electron density region is formed in the vicinity of the trench gate 19 upon application of positive voltage to the gate electrode 193. Further holes are drawn towards this high electron density region, and there is formed, in the IGBT element region 2, a high hole density region in the N$^-$ layer 14, in the vicinity of the boundary with the second P layer 152. In the present embodiment, the second N layer 161, as a carrier accumulation layer, is provided between the second P layer 152 and the third P layer 153 which are a body region. Therefore, the hole density in the N$^-$ layer 14 in the vicinity of the boundary with the second P layer 152 can be made higher than in a case where the second N layer 161 is not provided.

In the present embodiment, moreover, the third N layer 162 is provided in the boundary region 3, and the third N layer 162 contiguously contacts the second N layer 161 that is provided in the IGBT element region 2. As a result, motion of the holes as indicated by the broken line of FIG. 2 can be restricted. That is, providing the third N layer 162 in the boundary region 3 has the effect of restricting the motion of the holes towards the second P$^+$ layer 171 of the diode element region 1, via the fifth P layer 302 and so forth. The hole density in the N$^-$ layer 14 in the vicinity of the boundary with the second P layer 152 can be made higher than in a case where no third N layer 162 is provided in the boundary region 3.

(During diode operation)

Next, the IGBT element region 2 is switched from an on state to an off state, so that the diode element region 1 is brought into operation and there flows the return current. When the potential Va of the back electrode 40 is brought lower than the potential Vb of the diode upper surface electrode 41 and the potential Vc of the IGBT upper surface electrode 42 (Va<Vb, Vc), holes are injected into the N$^-$ layer 14, which is the second drift region, by the first P layer 151 that is the second body region, from the second P$^+$ layer 171, which is an anode region, at the diode element region 1, as illustrated in FIG. 3. As a result, the diode current (return current) flows from the second P$^+$ layer 171 (anode region) to the first N$^+$ layer 11 (cathode region), via the first P layer 151, the N$^-$ layer 14 and the first N layer 13. No current flows thus in the IGBT element region 2.

In the present embodiment, moreover, the third N layer 162 is provided in the boundary region 3, and the third N layer 162 contiguously contacts the second N layer 161 that is provided in the IGBT element region 2. As a result, motion of the holes as indicated by the broken line of FIG. 3 can be restricted. That is, providing the third N layer 162 in the boundary region 3 has the effect of restricting the motion of holes from the diode element region 1 towards the N$^-$ layer 14 of the boundary region 3, via the fifth P layer 302 and so forth. Thus, accumulation of holes in the N$^-$ layer 14 of the boundary region 3 is suppressed as compared with a case in which the second N layer 161 is provided in the IGBT element region 2 and no third N layer 162 is provided in the boundary region 3.

(During reverse recovery)

Next, the IGBT element region 2 is switched to an on state while return current is flowing in the diode element region 1. That is, a positive voltage (positive bias) is applied to the gate electrode 193 and the potential Va of the back electrode 40 is set to a higher potential than the potential Vb of the diode upper surface electrode 41 and the potential Vc of the IGBT upper surface electrode 42 (Va>Vb, Vc). In this case, a reverse recovery current flows in the diode element region 1. During reverse recovery of the diode, the carriers accumulated outside the diode element region 1 move towards the diode element region 1. During the reverse recovery of the diode, the holes accumulated in the N$^-$ layer 14 are dumped towards the first P layer 151 and the second P$^+$ layer 171, while the electrons accumulated in the N$^-$ layer 14 are dumped towards the first N layer 13 and the first N$^+$ layer 11. The current generated as a result of the motion of the carriers during the reverse recovery is called the reverse recovery current. The more carriers that accumulate in the N$^-$ layer 14, the greater the reverse recovery current is. An excessive reverse recovery current is likely to result in element breakdown.

In the present embodiment, accumulation of holes in the N$^-$ layer 14 of the boundary region 3 during diode operation is restricted, and hence the reverse recovery current during the diode reverse recovery can be kept small. The element breakdown during the reverse recovery of the diode can be suppressed as a result.

The configuration of the boundary region 3 is not limited to that of the above-described example. For instance, the configuration of the boundary region 3 may be such as the one illustrated in FIG. 4. In the semiconductor device 400 illustrated in FIG. 4, the configuration of the boundary region 3 is different from that of the semiconductor device 100 illustrated in FIG. 1. In the boundary region 3 illustrated in FIG. 4, a sixth P layer 312 is formed to the same depth as that of the first P layer 151 of the diode element region 1 and of the second P layer 152 of the IGBT element region 2. The third N layer 162 is formed in the sixth P layer 312, and the third N layer 162 and the N$^-$ layer 14 are separated from each other by the sixth P layer 312. The sixth P layer 312 is provided with a trench 39 that penetrates the sixth P layer 312 and the third N layer 162, from the upper surface side of the semiconductor substrate 10 and reaching the N$^-$ layer 14. Other features of the semiconductor device 400 are identical to those of the semiconductor device 100, and hence a recurrent explanation thereof will be omitted.

The boundary region is an inactive region where no contacts are formed between the semiconductor substrate and the upper surface electrode. The boundary region is provided between the diode element region and the IGBT element region. At the boundary region, the semiconductor substrate may comprise a second conductivity type first diffusion region, a first conductivity type second diffusion region and a second conductivity type third diffusion region provided in the second diffusion region and separated from the first diffusion region by the second diffusion region. A surface area of the "region at which no contact is formed between the semiconductor substrate and the upper surface electrode", provided in the boundary region is greater than a surface area of the "region at which no contact is formed between the semiconductor substrate and the upper surface electrode", provided in the active region i.e. in the diode element region or the IGBT element region.

In the boundary region, specifically, the semiconductor substrate may have a first conductivity type second diffusion region stacked on the upper surface side of a second conductivity type first diffusion region, and a second conductivity type third diffusion region provided in the second diffusion region and separated from the first diffusion region by the second diffusion region, such that at least one from among configurations (a) to (c) below are satisfied.

(a) The second diffusion region is a diffusion region (fifth P layer 302 in FIG. 1) formed to a position that is deeper than the lower end of the first body region of the IGBT element region (lower end of the second P layer 152 in FIG. 1) and than the lower end of the second body region of the diode element region (lower end of the first P layer 151 in FIG. 1).

Figure 4:
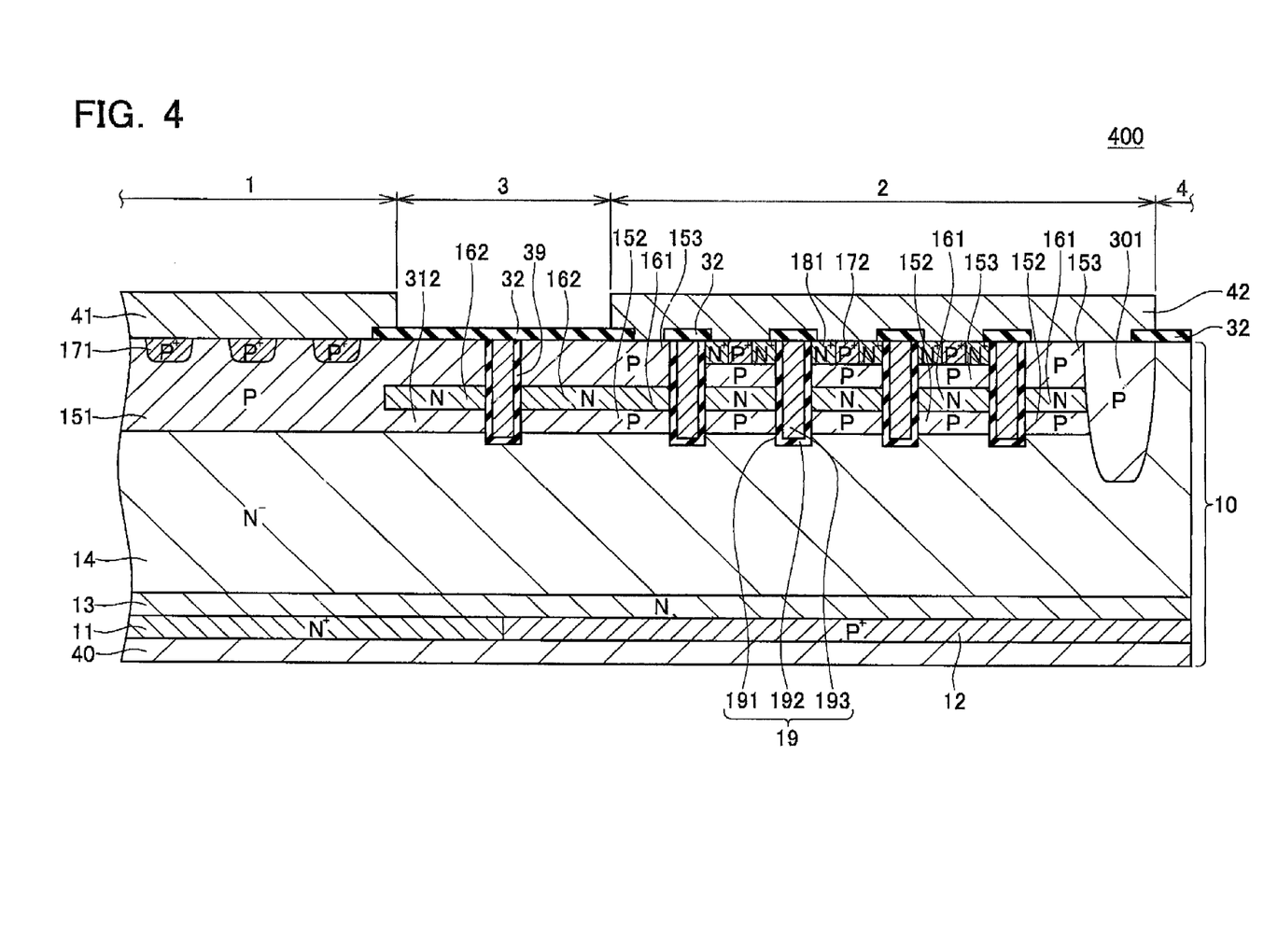
FIG. 4 is a cross-sectional diagram of a semiconductor device in a variation.

(b) The second diffusion region is a diffusion region (sixth P layer 312 in FIG. 4) formed to a depth identical to that of the first body region of the IGBT element region (second P layer 152 in FIG. 4) and that of the second body region of the diode element region (first P layer 151 in FIG. 4), and a trench (trench 39 in FIG. 4) is formed penetrating the second diffusion region (sixth P layer 312 in FIG. 4) from the upper surface side of the semiconductor substrate and reaching the first diffusion region (N⁻ layer 14 in FIG. 4).

(c) On the back side of the first diffusion region (side not contacting the second diffusion region) there is a boundary between a second conductivity type diffusion region (first N⁺ layer 11 in Embodiment 1) that constitutes a cathode region of a diode element region, and a first conductivity type diffusion region (first P⁺ layer 12 in Embodiment 1) that constitutes a collector region of an IGBT element region.

Providing a third diffusion region in the boundary region allows narrowing the path of carrier migration, even if the third diffusion region of the boundary region and the carrier accumulation region of the IGBT element region are not contacting each other. This elicits, as a result, an on-voltage reducing effect during IGBT operation, as well as an effect of reducing diode reverse recovery current. The third diffusion region need not be formed from the boundary between the IGBT element region and the boundary region up to the boundary between the diode element region and the boundary region; that is, the third diffusion region need just be formed at a portion of the foregoing. In this case, preferably, the third diffusion region is formed closer to the IGBT element region. In the above-described example, the third diffusion region is formed by the same semiconductor layer as that of the carrier accumulation region in the IGBT element region. However, the third diffusion region and the carrier accumulation region may be formed out of another semiconductor layer.

Some of the features of the above embodiment will be described. In the above semiconductor device, preferably, the third diffusion region of the boundary region extends to contiguously contact the carrier accumulation region of the IGBT element region. This allows further enhancing the inhibitory effect on carrier mobility during IGBT operation.

In the above semiconductor device, the third diffusion region of the boundary region and the carrier accumulation region of the IGBT element region may be formed as one same semiconductor layer. Thus, the carrier accumulation region and the third diffusion region can be formed simultaneously during the manufacturing process of the semiconductor device. As a result, the time and cost of the manufacturing process of the semiconductor device are not significantly increased.

Although an embodiment of the present teachings has been described using specific terms, such a description is for illustrative purposes only and is not intended to limit the scope of the following claims. The technology described in the claims is to include various modifications and changes made to the specific examples illustrated above.

The technological components illustrated in the present description and the accompanying drawings are designed such that the technical utility thereof is to be exercised either singularly or in combination, and are not limited to the combinations described in the claims upon application. In addition, the technology exemplified in the present description and the accompanying drawings are capable of simultaneously achieving a plurality of objects, whereby achieving one of such objects offers technical utility.

What is claimed is:

1. A semiconductor device comprising:
  an IGBT element region, a diode element region, and a boundary region between the IGBT element region and the diode element region, which are formed in one semiconductor substrate, wherein
  the IGBT element region comprises:
  a first conductivity type collector region,
  a second conductivity type first drift region formed on an upper surface side of the semiconductor substrate relative to the collector region,
  a first conductivity type first body region formed on the upper surface side of the semiconductor substrate relative to the first drift region,
  a second conductivity type emitter region formed on an upper surface side of the first body region,
  a second conductivity type carrier accumulation region formed in the first body region and separated from both of the first drift region and the emitter region by the first body region, and
  a trench gate penetrating the first body region from the upper surface side of the semiconductor substrate and reaching the first drift region,
  the diode element region comprises:
  a second conductivity type cathode region,
  a second conductivity type second drift region formed on the upper surface side of the semiconductor substrate relative to the cathode region, and
  a first conductivity type second body region formed on the upper surface side of the semiconductor substrate relative to the second drift region,
  the boundary region comprises:
  a second conductivity type first diffusion region,
  a first conductivity type second diffusion region formed on the upper surface side of the semiconductor substrate relative to the first diffusion region, and
  a second conductivity type third diffusion region formed in the second diffusion region and separated from the first diffusion region by the second diffusion region, the first drift region of the IGBT element region contiguously contacts the first diffusion region of the boundary region, the second drift region of the diode element region contiguously contacts the first diffusion region of the boundary region, the first body region of the IGBT element region contiguously contacts the second diffusion region of the boundary region, and the second body region of the diode element region contiguously contacts the second diffusion region of the boundary region.

2. The semiconductor device according to claim 1, wherein the third diffusion region of the boundary region extends to contiguously contact the carrier accumulation region of the IGBT element region.

3. The semiconductor device according to claim 2, wherein the third diffusion region of the boundary region and the carrier accumulation region of the IGBT element region are formed as one semiconductor layer.

* * * * *